United States Patent [19]

Sakashita et al.

[11] Patent Number: 4,780,666

[45] Date of Patent: Oct. 25, 1988

[54] SEMICONDUCTOR INTEGRATED CIRCUIT DEVICE HAVING REST FUNCTION

[75] Inventors: Kazuhiro Sakashita; Satoru Kishida; Toshiaki Hanibuchi; Ichiro Tomioka; Takahiko Arakawa, all of Itami, Japan

[73] Assignee: Mitsubishi Denki Kabushiki Kaisha, Tokyo, Japan

[21] Appl. No.: 81,256

[22] Filed: Aug. 3, 1987

[30] Foreign Application Priority Data

Aug. 4, 1986 [JP] Japan .................................. 61-183685

[51] Int. Cl.⁴ ............................................ G01R 15/12
[52] U.S. Cl. ............................ 324/73 R; 324/158 R; 324/73 AT; 371/20; 371/25
[58] Field of Search ............ 324/73 R, 73 AT, 158 R; 371/20, 25, 15, 22, 16, 17

[56] References Cited

U.S. PATENT DOCUMENTS 4,357,703  11/1982  Van Brunt ..................... 324/73 R X
4,493,077  1/1985  Agrawal et al. ........... 324/73 AT X
4,602,210  7/1986  Fasang et al. ................ 324/73 R X Primary Examiner—Reinhard J. Eisenzopf
Assistant Examiner—Vinh P. Nguyen
Attorney, Agent, or Firm—Nixon & Vanderhye

[57] ABSTRACT

A semiconductor integrated circuit device includes a plurality of latch circuits which are provided between adjacent circuit blocks. Each latch circuit functions to transfer output data from a preceding circuit block directly to a subsequent circuit block during a normal operation of the circuit device, to hold the output data until a scanning of associated scan register and supply them to the subsequent circuit block in a scan mode of a test operation and to hole the output data while outputting them in synchronism with an external clock in a test mode of the test operation.

3 Claims, 4 Drawing Sheets

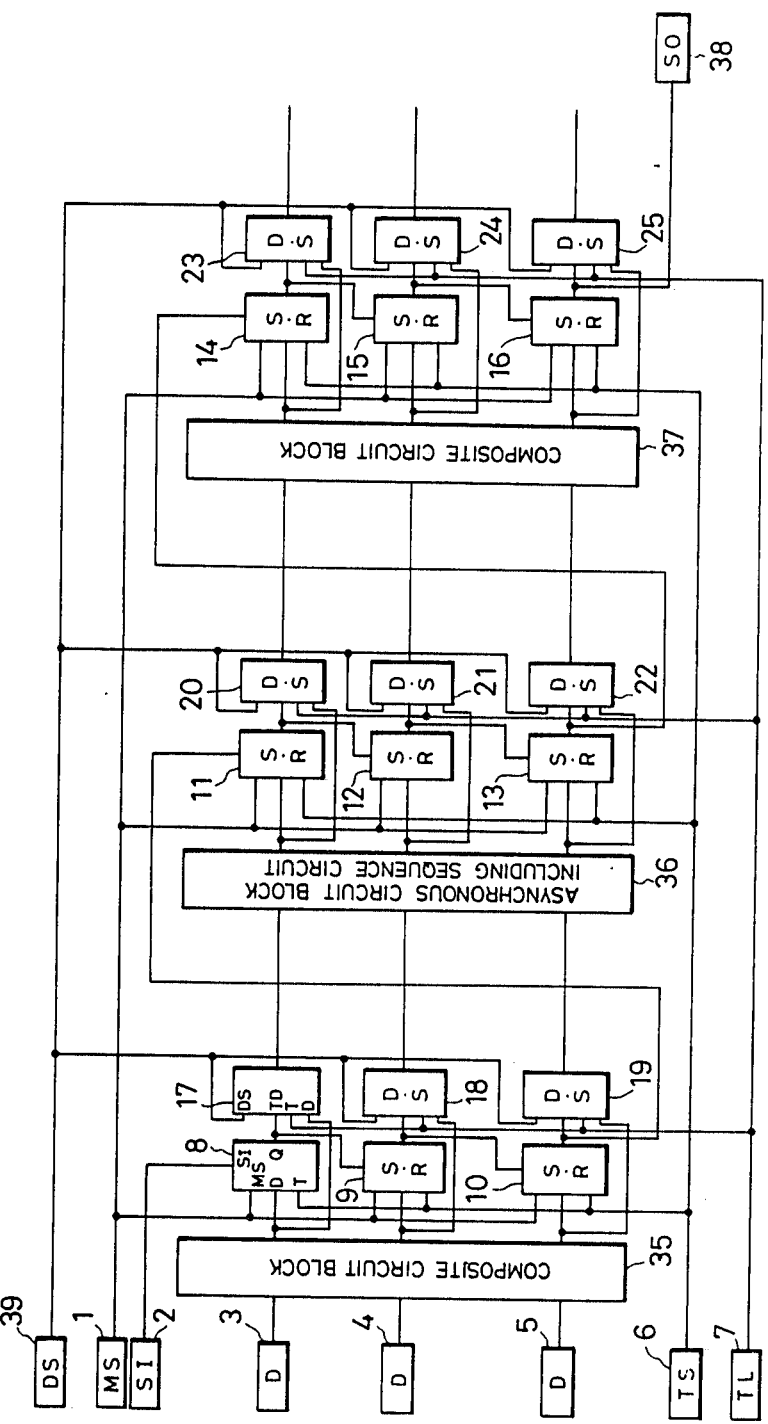

SEMICONDUCTOR INTEGRATED CIRCUIT DEVICE HAVING REST FUNCTION

BACKGROUND OF THE INVENTION

The present invention relates to a semiconductor integrated circuit device and, particularly, to such circuit device having a test function for testing itself.

With the recent development of fine processing techniques to be used in fabricating such integrated circuit device, the integrity of semiconductor integrated circuit device has been improved more and more. With such improved integrity of semiconductor integrated circuit device, i.e., increased number of gates included therein, the test thereof becomes very difficult necessarily. The easiness of such test may depend upon easiness of detection of respective terminal failures (observability) and easiness of setting the respective terminals to desired theoretical values (controllability). It is known that the observability and the controllability of terminals behind various circuit elements of a large scale integrated circuit device are generally poor.

The scan test method has been used as a test method of semiconductor integrated circuit device, which comprises the steps of inserting register circuits having a shift register function as a whole into suitable points of a logic circuit network, connecting these registers together by means of a single shift register path, inputting, serially and externally, test pattern to set desired data in these registers when the logic circuit is tested, applying a desired logic signal to a logic circuit block of the logic circuit network connected to data output terminals of the registers to activate the network, deriving an output of the logic circuit block through parallel input terminals of the registers thereinto in parallel, providing them serially externally of a chip and observing them. With this method, the observability and the controllability of terminals behind various elements of the large scale integrated circuit device are improved.

A basic idea of scan test concerning a level sensitives synchronous circuit is disclosed in Japanese Patent Application Laid-Open No. 74668/1981.

Since semiconductor integrated circuit device to which the present invention relates includes an asymmetric sequence circuit, the content of the Laid-Open No. 74668/1981 will be referred to as an example of a conventional test method. FIG. 1 which corresponds to FIG. 2 of the Laid-Open No. 74668/1981 shows a test circuit which includes composite circuit blocks 35 and 37, an asymmetric sequence circuit block 36 including a sequence circuit, scan registers 8 to 16 each provided between adjacent ones of the circuit blocks and data selectors 26 to 34 each functioning to select either an output of a corresponding circuit block or an output of a corresponding scan register. Data input terminals of the scan registers and data input terminals D of the data selectors are supplied directly with output signals of the respective circuit blocks and test data input terminals TD of the data selectors are connected to output terminals Q of the corresponding scan registers.

A test mode selection terminal 1 is connected to mode selection terminals MS of the scan registers and the data selectors. A scan-in terminal 2 is connected to scan-in terminals SI of the scan register 8 whose output terminal Q is connected to a scan-in terminal SI of the scan register 9. A reference numeral 38 depicts a scan-out terminal.

The output terminals Q of the scan registers are connected to the scan-in terminals SI of subsequent ones of the scan registers respectively sequentially, in this manner. As a result, a shift register path is formed between the scan-in terminal 2 and the scan-out terminal 38. In FIG. 1, reference numerals 3, 4 and 5 are ordinary data input terminals and 6 is a scan clock input terminal which is connected to clock input terminals T of the scan registers.

FIG. 2 shows an example of a circuit construction of the above mentioned scan register, which includes a mode selection terminal MS, a data input terminal D, a scan-in terminal SI, a clock input terminal T, an inverter gate 51, two-input AND gates 52 and 53, a two-input OR gate 54 and a D type flipflop (D-FF) 55 of edge trigger type, Q being a data output terminal.

FIG. 3 shows an example of the data selector circuit in FIG. 1, which includes a mode selection terminal MS, a test data input terminal TD, a data input terminal D, an inverter gate 60, two-input AND gates 61 and 62 and a two-input OR gate 63, Y being an output terminal.

In a normal operation of the logic circuit network, a "H" signal is applied to the test mode selection terminal 1 (MS) and the scan clock terminal 6 (TS or T) is fixed to "L". As a result, the output terminals of the circuit blocks are connected through the data selectors to the input terminals of the corresponding circuit blocks.

That is, in FIG. 3, when "H" signal is applied to the mode selection terminal MS, the data selection circuit provides data supplied to the data input terminal D as an output at the output terminal Y through the AND gate 62 and the OR gate 63. Since the output at the output terminal Y of this circuit block is directly connected to the data input terminal D of the data selector, the output terminal Y is directly connected to the input terminal of the subsequent circuit block.

In performing a test operation, the scan mode operation and a test mode operation are expected sequentially repeatedly as follows:

SCAN MODE (a) The scan mode is selected by applying "H" signal to the test mode selection terminal 1, so that the input data from the scan-in terminal SI is selected in the scan register and the input data from the data input terminal D becomes effective in the data selector.

(b) Test data set for the respective scan registers through the scan terminal 2 are scanned-in sequentially in synchronism with clock signal applied to the scan clock terminal 6.

(c) At the same time, the output data of the respective circuit blocks taken in during a preceding test are scanned-out sequentially from the scan-out terminal 38.

Describing this operation in more detail with reference to FIGS. 2 and 3, in the scan registers, when "H" signal is applied to the mode selection terminal MS, the data from the scan-in terminal SI are supplied through the AND gate 53 and the OR gate 54 to the D-FF 55 and held therein in synchronism with the clock signal supplied to the clock terminal T, and, at the same time, data which have been held therein are outputted from the output terminal Q. Since, at this time, the "H" signal is also supplied to the mode selection terminal MS of the data selector, data from the data input terminal D appear at the output terminal Y.

TEST MODE (a) After desired data are set in the respective scan registers, an "L" signal is applied to the test mode selection terminal 1 to select the test mode.

(b) With this selection of mode, the output data of the scan registers are applied through the test data input terminal TD of the data selector to the respective circuit blocks.

(c) At the same time, the desired test data are supplied to the data input terminals 3 to 5.

(d) Then, at a time when the operation of the circuit blocks complete, a clock is supplied to the scan clock input terminal 6. With this, the output signals of the respective circuit blocks are held in the D-FFs of the corresponding scan register through the data input terminals D.

That is, in FIGS. 2 and 3, when the "L" signal is applied to the mode selection terminal MS, the data from the data input terminal D of the scan register are sent through the AND gate 52 and the OR gate 54 to the D-FF 55 and held therein in synchronism with the clock signal supplied to the clock input terminal T. At this time, since the "L" signal is also supplied to the mode selection terminal MS of the data selector, the data from the test data input terminal TD appears through the AND gate 61 and the OR gate 63 at the output terminal Y.

The test of the respective circuit blocks can be performed in this manner. In the scanning operation in this circuit device, the data selector selects output data of the respective circuit blocks and a status of the circuit block 36 including the sequence circuit is kept unchanged even if the output value of the scan register changes sequentially. Therefore, the scan test becomes possible even if the circuit block encircled by the scan path is an asymmetric sequence circuit.

However, when the operation mode is switched from the test mode to the scan mode, the data supplied to the sequence circuit is changed from the serially inputted signal value to the output signal value of the adjacent circuit block. Therefore, it becomes very difficult to set the input so as not to change the status of the asymmetric sequence circuit to be considered, resulting in difficulties in performing effective scan test.

SUMMARY OF THE INVENTION

An object of the present invention is to provide a semiconductor integrated circuit device capable of being scantested easily, together with circuit blocks including an asymmetric sequence circuit.

The semiconductor integrated circuit device according to the present invention includes, at an output terminal of each of scan registers, a latch circuit which has a selection function for selecting either of an output data of the scan register or an output data of a corresponding, preceding circuit block as well as a data transfer function for holding and outputting or directly outputting a selected data. The latch circuit, during a normal operation of the device, provides the output data of the preceding circuit block to a subsequent circuit block as it is. In a scan mode during a test mode operation, the latch circuit holds a test data obtained prior to the scan operation and continues to supply the data to the subsequent circuit block. In a test mode during the test mode operation, the latch circuit holds the ouput data of the corresponding scan register and outputs the data in synchronism with an external clock signal.

In the present invention, during the normal operation of the semiconductor integrated circuit device, the output terminal of one circuit block is connected via the selection function and the data transfer function of the latch circuit to the input of the subsequent circuit block. During the test operation, the output data of the scan register is selected and held by the selection function of the latch circuit and transferred to the input terminal of the corresponding circuit block and, in the scan mode, the latch circuit continues to supply the previous test data to the corresponding circuit block.

BRIEF DESCRIPTION OF THE DRAWING

FIG. 4 is a block diagram of a semiconductor integrated circuit device according to an embodiment of the present invention;

DETAILED DESCRIPTION OF THE PREFERRED EMBODIMENTS

Figure 1:
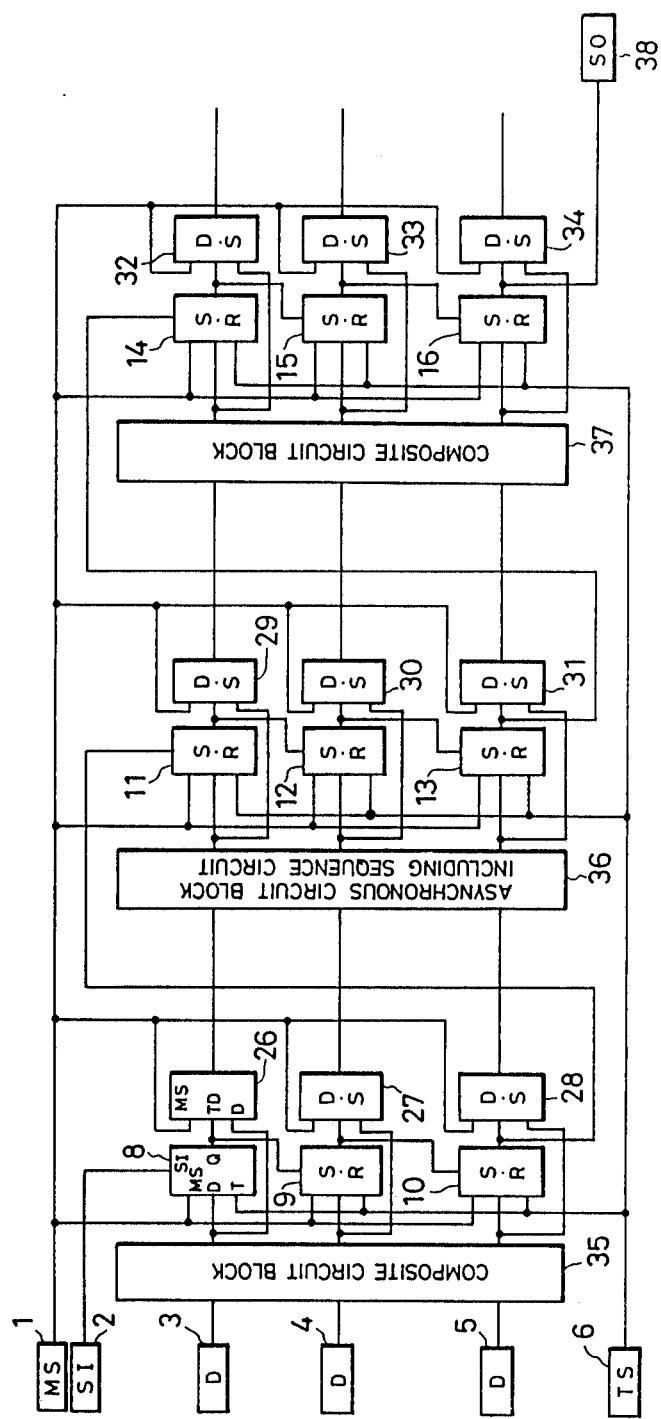
FIG. 1 is a block diagram of a conventional semiconductor integrated circuit device.
Figure 2:
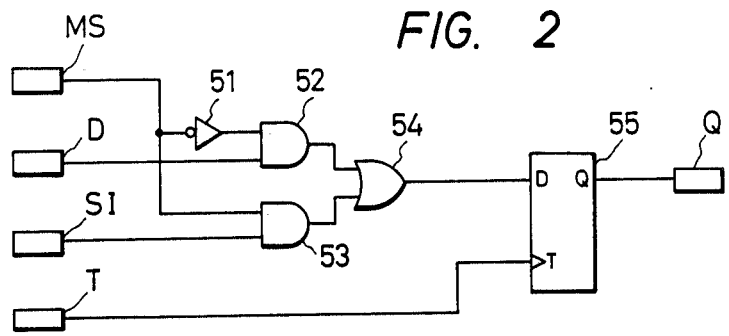
FIG. 2 is a conventional scan register of the circuit device in FIG. 1.
Figure 3:
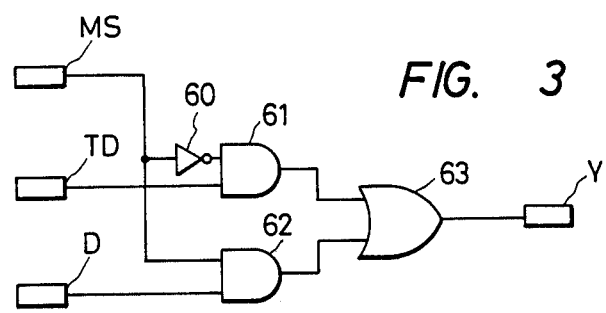
FIG. 3 is a circuit diagram of a selection circuit of the circuit device in FIG. 1.

In FIG. 4, a composite circuit blcok 35, a circuit block 36 including asymmetric sequence circuit and another composite circuit block 37 are connected in series in the order with a combination circuit of a plurality of scan registers and a corresponding number of latch circuits between adjacent ones of the circuit blocks 35, 36 and 37. The combination circuit arranged between the circuit blocks 35 and 36 includes scan registers 8, 9, and 10 and latch circuits 17, 18 and 19 connected in series with the respective scan registers 8, 9 and 10. The combination circuit arranged between the circuit blocks 36 and 37 includes scan registers 11, 12 and 13 and latch circuits 20, 21 and 22 in series with the respective scan registers 11, 12 and 13, and the circuit block 37 is connected to a subsequent circuit (not shown) via scan registers 14, 15 and 16 and latch circuits 23, 24 and 25. Each latch circuit has an input selection function as well as a data transfer function. Outputs of the respective circuit blocks are connected directly to data input terminal D of the corresponding scan registers and data input terminals D of the corresponding latch circuits, respectively. Output terminals Q of the latch circuits are connected to input terminals of the corresponding circuit blocks, respectively. To test data input terminals TD of the latch circuits, output terminals Q of the corresponding scan registers are connected, respectively.

A test mode terminal 1 is connected to mode selection terminals MS of the respective scan registers. A scan-in terminal 2 is connected to a scan-in terminal SI of the scan register 8 whose output terminal Q is connected to a scan-in terminal SI of the scan register 9 whose output terminal Q is connected to a scan-in terminal SI of the scan register 10. The output terminal of the scan register 10 is connected to a scan-in terminal SI of the scan register 11 and so on. As a result, a scan path is formed between the scan-in terminal 2 and a scan-out terminal 38 connected to an output terminal Q of the scan register 16.

A scan clock input terminal (TS) 6 is connected to clock input terminals T of the respective scan registers 8 to 16 and a clock input terminal (TL) 7 is connected to clock input terminals T of the respective latch circuits 17 to 25. A data selection terminal (DS) 39 is connected to the selection terminals MS of the respective latch circuits 17 to 25.

Data input terminals 3 to 5 are connected to the composite circuit block 35.

Figure 5:
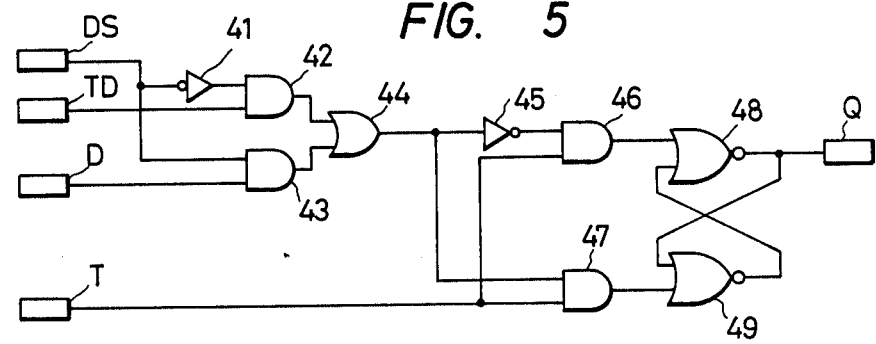
FIG. 5 is a circuit diagram of a latch circuit in FIG. 4.

FIG. 5 shows an example of a circuit diagram of the latch circuit in FIG. 4, in which a data input terminal DS is connected to one input of a two-input AND gate 43 and through an inverter 41 to one input of a two-input AND gate 42. A test data input TD is connected to the other input of the AND gate 42 and a data input D is connected to the other input of the AND gate 43. A clock input is connected to one inputs of two-input AND gates 46 and 47. Outputs of the AND gates 42 and 43 are connected to inputs of a two-input NOR gate 44 whose output is connected to the other input of the AND gate 47 and, through an inverter 45 to the other input of the AND gate 46. An output of the AND gate 46 is connected to one of two inputs of a NOR gate 48 and an output of the AND gate 47 is connected to one of two inputs of a NOR gate 49 whose output is connected to the other input of the NOR gate 48. An output of the latter is connected to the other input of the NOR gate 49 and to an output terminal Q of the latch circuit.

Each of the latch circuits 17 to 25 serves to hold an input data of either the test data input TD or the data input terminal D depending upon a value of signal applied to the selection terminal and to supply a data held therein the output terminal Q, when a positive clock is supplied to the clock input T thereof. When an "L" data is applied to the clock input T, the latch circuit performs its holding operation regardless of values applied to the input terminals D, TD and DS, while, during an "H" signal is applied to the clock input T, it selects the input data at either the test data input TD or the data input terminal D depending upon a value of the signal at the selection terminal DS and transfers the data directly to the output terminal Q (data transfer function).

The operation of each scan register is the same as that of the conventional one. Describing a normal operation of the latch circuits, both the data selection terminal 39 and the clock input terminal 7 are supplied with "H" signal. Thus, the respective latch circuits select the data at the data input terminal D and transfer them to the output terminals Q thereof. Therefore, the adjacent circuit blocks are connected to each other through the latch circuits regardless of the operation of the associated scan registers.

The tests of the respective circuit blocks are performed by executing scan mode operations and test mode operations alternatively, which are as follows:

SCAN MODE OPERATION (a) An "L" signal is applied to the data selection termial 39, so that the latch circuits select the data at the test data input terminals TD.

(b) The clock input terminal 7 is fixed to "L" to make the respective latch circuits in holding states and to continue to apply a previously applied test data to the circuit blocks.

(c) By applying "H" signal to the test mode selection terminal 1, the input data of the scan register is set at the scan-in terminal SI.

(d) The test data at the scan-in terminal 2 is scanned-in sequentially to the scan registers in synchronism with clock signal applied to the scan clock input 6.

(e) Simultaneously therewith, the output data stored in the respective circuit blocks during a preceding test mode operation are scanned-out sequentially from the scan-out terminal 38.

TEST MODE OPERATION (a) A positive clock is applied to the clock input 7 after the respective scan registers are set with desired test data.

(b) With the positive clock, the test data in the scan registers corresponding to the respective latch circuits are held therein and new test data are applied to the circuit blocks.

(c) Simultaneously therewith, test data are applied to the data inputs 3 to 5.

(d) Then, an "L" signal is applied to the test mode selection terminal 1 and the inputs of the scan registers are set in the sides of the data input terminals D.

(e) At a time when the operation of the respective circuit blocks complete, a clock is supplied from the scan clock input 6 to the scan registers to supply the output data from the respective circuit blocks to the scan registers and hold them therein.

The tests of the respective circuit blocks are performed in this manner. Further, in the present invention, since the latch circuits 17 to 25 hold the preceding test pattern and continue to apply them to the input terminals of the respective circuit blocks during the scanning operation, the statuses of the respective circuit blocks are kept unchanged even when the contents of the scan registers are changed during the scanning operation and, thus, the scan test is also possible.

Figure 6:
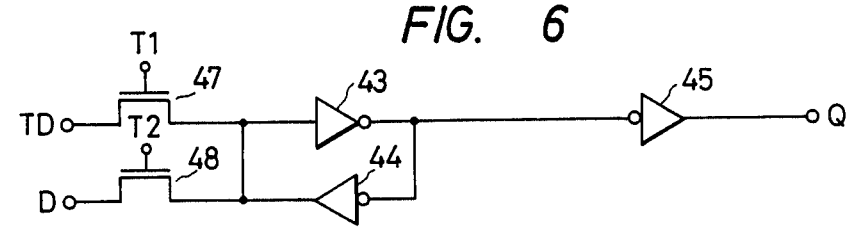
FIG. 6 is another embodiment of the latch circuit in FIG. 4.

FIG. 6 shows another embodiment of the latch circuit usable in the circuit device in FIG. 4 which is constituted with a transmission gates. In FIG. 6, the latch circuit is composed of a pair of parallel connected n type MOS transisters 47 and 48 having drains connected together to form the transmission gates. A pair of inversely connected parallel inverters 43 and 44 are connected between the drain junction and another inverter 45 whose output is connected to the output terminal Q. A source of the MOS transister 47 is connected to a test data input TD and a source of the MOS transister 48 is connected to a data input D. Gates of the MOS transisters 47 and 48 are connected to a first clock input $T_1$ and a second clock input $T_2$, respectively.

In this construction of the latch circuit, a load drive performance of the inverter 44 is relatively small and, therefore, when either the gate 47 or 48 are opened, data corresponding to the respective latch circuits are inputted thereto and held therein.

A selection of input data during a shift operation is performed by applying on-signals to either inputs $T_1$ or $T_2$, so that the clock at the clock inputs $T_1$ or $T_2$ serves as synchronizing clock as well as data selection signal for the latches.

Figure 7:
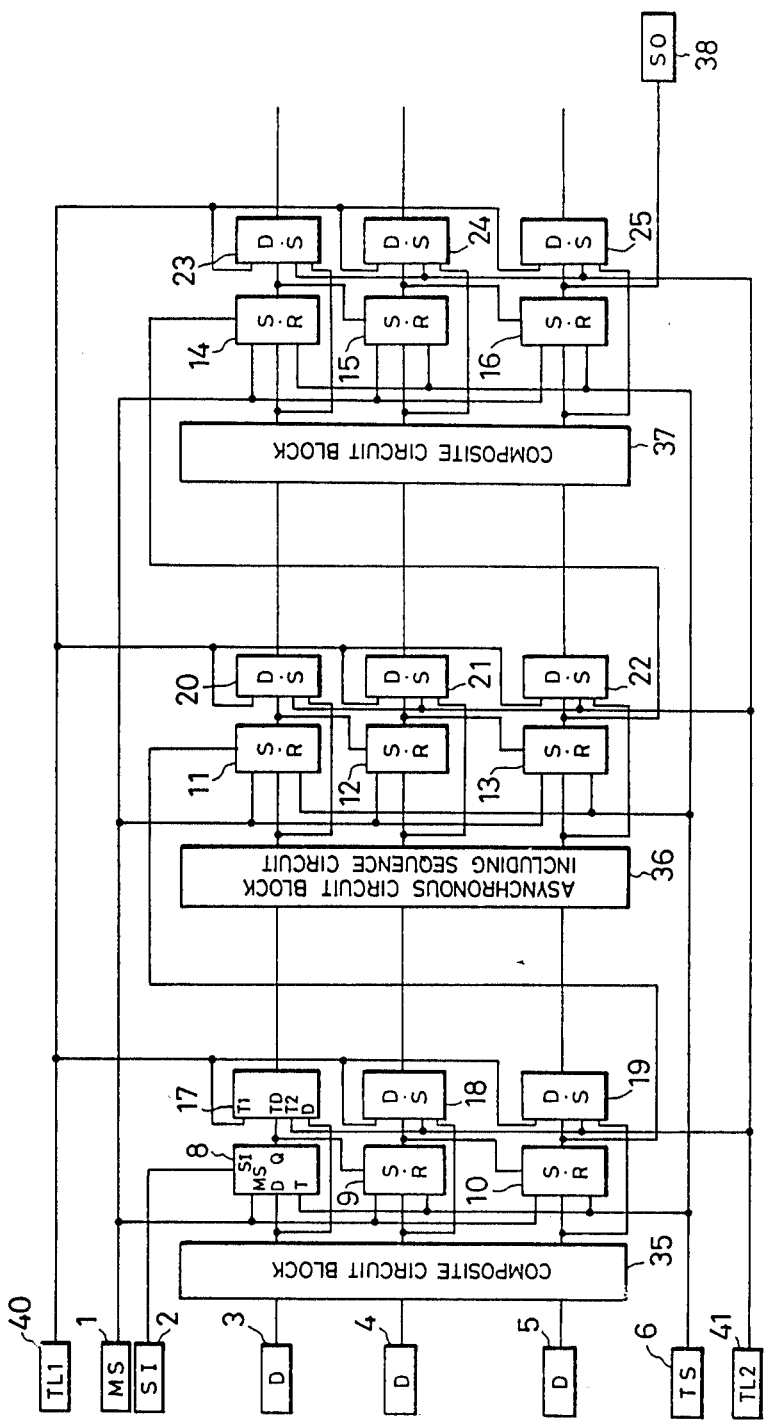
FIG. 7 is a block circuit diagram of another embodiment of the present invention in which the latch circuit in FIG. 6 is used.

FIG. 7 shows the test circuit in which the latches each shown in FIG. 6 are used and which is the same as that shown in FIG. 4 except, in addition to the latch circuits, that a first clock input (TL1) 40 and a second clock input (TL2) 41 are substituted for the data selection terminal DS and the latch clock input TL in FIG.

1, respectively, and each latch circuit includes the first and second gates $T_1$ and $T_2$ instead of the selection terminal DS and the clock input TL. The operation of the circuit device in FIG. 7 is substantially the same as that of the circuit device shown in FIG. 4 except that the signals at the clock inputs 40 and 41 also serve as the selection signals for the input data to the latch circuits.

As mentioned hereinbefore, according to the present invention, a latch circuit having an input selection function as well as a data transfer function is arranged between a scan register connected to a circuit block and a subsequent circuit block. Therefore, it is possible to perform a signal transfer between adjacent circuit blocks regardless of the scan register, during a normal operation of the semiconductor integrated circuit device. Further, since it is possible to supply test data supplied to the circuit blocks in a preceding test period to the same circuit blocks continuously, a scan test for an asymmetric sequence circuit can be easily performed. Thus, a large scale integrated circuit device including asymmetric sequence circuits, whose test design is facilitated with minimum expense.

What is claimed is:

1. A semiconductor integrated circuit device having a test function, said semiconductor integrated circuit device including a plurality of logic circuit blocks at least one of which includes a sequence circuit, data being transferred through said circuit blocks while permitting scan test of said respective circuit blocks, comprising:

a plurality of scan registers arranged between each paired adjacent ones of said circuit blocks for holding an output data from a corresponding output of a preceding one of said paired circuit blocks or scan test data and outputting said data to a data input of a subsequent one of said paired circuit blocks in synchronism with an external clock during a test operation, said scan registers corresponding in number to data bits to be transferred through said circuit blocks, said scan registers arranged between respective pairs of adjacent circuit blocks being connected in series to constituting a shift register;

a plurality of latch circuits corresponding in number to said scan registers, each said latch circuit having a first data input connected to said corresponding output terminal of said preceding circuit block and a second data input connected to a data output of a corresponding one of said scan registers, each said latch circuit being adapted to transfer said output data of said preceding circuit block directly to said subsequent circuit block during a normal operation of said semiconductor integrated circuit device, to hold data of said corresponding scan register until a start of scanning operation and supply them continuously to said subsequent circuit block in a scan mode of a test operation and to hold said output data of said corresponding scan register while outputting said output data in synhronism with an external clock in a test mode of said test operation;

test data setting means for setting serial test data in respective said scan registers, externally;

test result providing means for providing, externally, said data of respective said scan registers as serial data; and selection means for switching an operation of said semiconductor integrated circuit device between said normal operation and said test operation and between said scan mode and said test mode of said test operation.

2. The semiconductor integrated circuit device as claimed in claim 1, wherein each said latch circuit comprises a first AND gate having one input connected to said output of said corresponding scan register, a second AND gate having one input connected to a corresponding output of said preceding circuit block, a first OR gate having inputs connected to outputs of said first and second AND gates, a third AND gate having one input connected through an inverter to an output of said OR gate, a fourth AND gate having one input connected to said output of said OR gate and the other input connected to an external clock, a first NOR gate having one input connected to an output of said second AND gate and a third NOR gate having one input connected to an output of said fourth AND gate and the other input connected to an output of said first NOR gate, the other input of said first NOR gate being connected to an output of said second NOR gate, said output of said first NOR gate being adapted to be said output of said latch circuit.

3. The semiconductor integrated circuit device as claimed in claim 1, wherein each said latch circuit comprises a pair of parallel connected MOS transistors and an inverter circuit connected in series with said parallel MOS transistors, said inverter circuit composed of a pair of reversely connected parallel inverters and an inverter connected in series with said parallel inverters and having an output serving as said output of said latch circuit, sources of said parallel MOS transistors being connected to said first and second data inputs, respectively and gates thereof being connected to external clocks, respectively, each of which serves as synchronizing clock as well as data selection signal.

* * * * *